United States Patent
Schwab et al.

(10) Patent No.: US 6,767,841 B2
(45) Date of Patent: Jul. 27, 2004

(54) PROCESS FOR PRODUCING A SEMICONDUCTOR WAFER

(75) Inventors: Günter Schwab, Emmerting (DE); Helmut Franke, Burghausen (DE); Manfred Schöfberger, Reut (DE)

(73) Assignee: Siltronic AG, München (DE)

( * ) Notice: Subject to any disclaimer, the term of this patent is extended or adjusted under 35 U.S.C. 154(b) by 0 days.

(21) Appl. No.: 09/764,634

(22) Filed: Jan. 18, 2001

(65) Prior Publication Data

US 2003/0022506 A1 Jan. 30, 2003

(30) Foreign Application Priority Data

Jan. 20, 2000 (DE) .......................................... 100 02 354

(51) Int. Cl.⁷ ............................................ H01L 21/302
(52) U.S. Cl. ...................... 438/745; 438/747; 438/748; 438/749; 438/753
(58) Field of Search ............................... 438/692, 745, 438/747, 748, 749, 753

(56) References Cited

U.S. PATENT DOCUMENTS

| | | | |
|---|---|---|---|
| 5,451,267 A | 9/1995 | Stadler et al. | 134/30 |
| 5,474,644 A | 12/1995 | Kato et al. | 156/345.11 |
| 5,698,040 A | * 12/1997 | Guldi et al. | 134/1.3 |
| 5,967,156 A | * 10/1999 | Rose et al. | 134/7 |
| 6,245,677 B1 | * 6/2001 | Haq | 438/690 |
| 6,532,976 B1 | * 3/2003 | Huh et al. | 134/111 |

FOREIGN PATENT DOCUMENTS

| | | |
|---|---|---|
| DE | 198 05 835 | 8/1999 |
| EP | 06735545 | 10/1984 |
| EP | 0637064 | 2/1995 |
| EP | 090640 | 2/1998 |
| JP | 6281031 | 4/1987 |
| JP | 03-284844 | 12/1991 |
| JP | 06-084881 | 3/1994 |
| JP | 2000-106355 | 4/2000 |

OTHER PUBLICATIONS

English Derwent Abstract AN 1999–459666 corresponding to DE 19805835.
English Abstract corresp. to JP 06–084887.
English Abstract corresp. to JP 03–284844.
English Abstract corresp. to JP 2000–106355.

* cited by examiner

Primary Examiner—Nadine G. Norton
Assistant Examiner—Binh X. Tran
(74) Attorney, Agent, or Firm—Collard & Roe, P.C.

(57) ABSTRACT

A process for producing a semiconductor wafer is based upon etching the semiconductor wafer with an etching medium flowing in a laminar flow along a direction of flow toward an edge of the semiconductor wafer. There is a protective shield arranged in front of the edge of the semiconductor wafer, so that the etching medium flows onto the protective shield and not onto the edge of the semiconductor wafer. There is also a process that has the semiconductor wafer being inclined with respect to the direction of flow of the etching medium, so that there is an angle of less than 180° between the direction of flow of the etching medium and a first side of the semiconductor wafer. Also, there is an angle of greater than 180° between the direction of flow of the etching medium and a second side of the semiconductor wafer, and the second side of the semiconductor wafer is subsequently polished.

7 Claims, 4 Drawing Sheets

PROCESS FOR PRODUCING A SEMICONDUCTOR WAFER

BACKGROUND OF THE INVENTION

1. Field of the Invention

The present invention relates to a process for producing a semiconductor wafer by etching and, if appropriate, polishing of the semiconductor wafer.

2. The Prior Art

Processes for etching a semiconductor wafer are described, for example, in U.S. Pat. No. 5,451,267, EP 930 640 A2 and EP 673 545 B1. In these processes, an etching medium flows frontally onto an edge of the semiconductor wafer while the semiconductor wafer is rotating if appropriate. If a semiconductor wafer which has been treated in this manner is subsequently polished on one side, it is possible to detect an elevation in an edge region of the polished side of the semiconductor wafer, extending in annular form along the circumference of the semiconductor wafer. The surface structure of a semiconductor wafer of this prior art type is illustrated in FIG. 1.

SUMMARY OF THE INVENTION

It is an object of the present invention to provide a process for producing a semiconductor wafer in which the formation of the abovementioned elevation, which is known as an edge gutter, is avoided.

According to a first embodiment of the invention, this object is achieved by a process for producing a semiconductor wafer by etching the surface of the semiconductor wafer, with an etching medium flowing in a laminar flow along a direction of flow toward an edge of the semiconductor wafer. There is a protective shield placed in front of the edge and adjacent to the edge of the semiconductor wafer, so that the etching medium firstly flows onto the protective shield and not onto the edge of the semiconductor wafer. Then the etching medium is caused to have a laminar flow across the wafer surface.

According to a second embodiment of the invention, this object is achieved by a process for producing a semiconductor wafer by etching and polishing the semiconductor wafer. During the etching of the semiconductor wafer an etching medium is flowing in a laminar flow along a direction of flow toward an edge of the semiconductor wafer. The semiconductor wafer is inclined with respect to the direction of flow of the etching medium, so that there is an angle of less than 180° between the direction of flow of the etching medium and a first side of the semiconductor wafer. Also there is an angle of greater than 180° between the direction of flow of the etching medium and a second side of the semiconductor wafer, and the second side of the semiconductor wafer is subsequently polished after the etching step.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views:

FIGS. 4 and 5 compare the prior art and the first embodiment of the invention with one another in order to illustrate the effect of the protective shield.

DETAILED DESCRIPTION OF PREFERRED EMBODIMENTS

Figure 1:
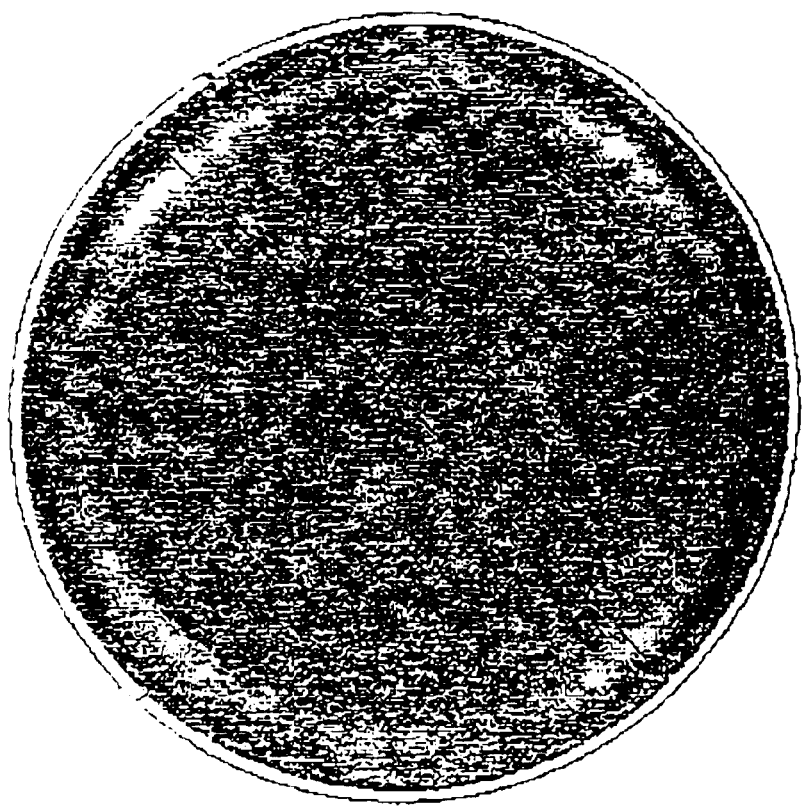
FIG. 1 show the surface structure of a semiconductor wafer of the prior art with an edge gutter.
Figure 4:
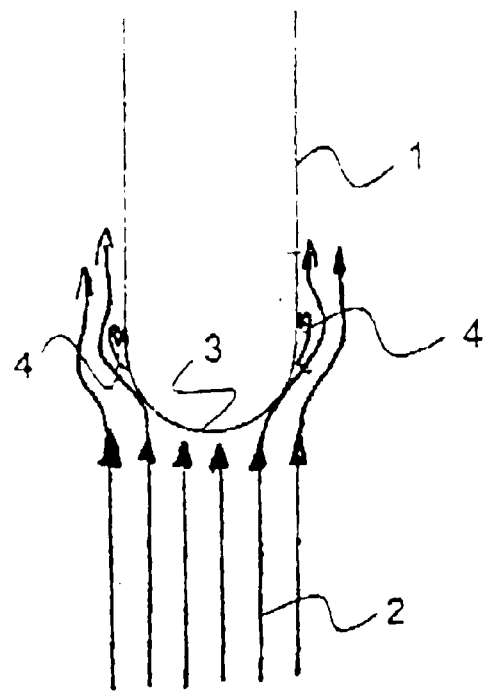
FIG. 4 shows the wafer etching without a protective shield according to the prior art.

Research carried out by the inventors has shown that the etching medium becomes a turbulent flow downstream of the edge of the semiconductor wafer 1 if the etching medium, in accordance with the prior art, flows frontally, in a laminar flow 2, onto the edge 3 of the semiconductor wafer. This situation is illustrated in FIG. 4. The turbulence or turbulent flow 4 causes increased etching abrasion in the edge region on both sides of the semiconductor wafer. After polishing of one side of the semiconductor wafer, the abovementioned prior art elevation is formed in the edge region of the polished side of the semiconductor wafer, as shown in FIG. 1.

Figure 5:
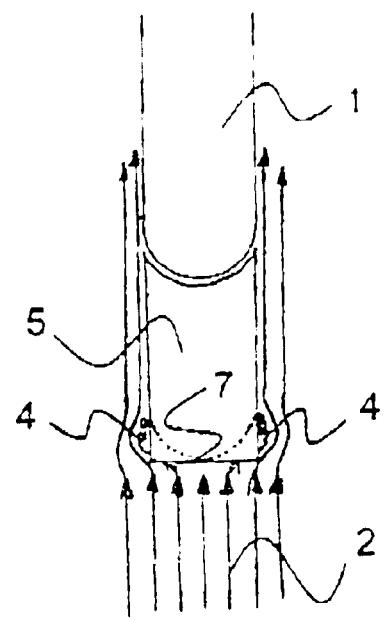
FIG. 5 shows the wafer etching with a protective shield according to the invention.

If, according to the first embodiment of the invention, a protective shield 5 is arranged adjacent to and in front of the edge 3 of the semiconductor wafer 1, a turbulent boundary layer, which forms in the prior art etching medium, is kept away from the sides of the semiconductor wafer. This is according to the invention, and this is shown in FIG. 5.

Figure 2:
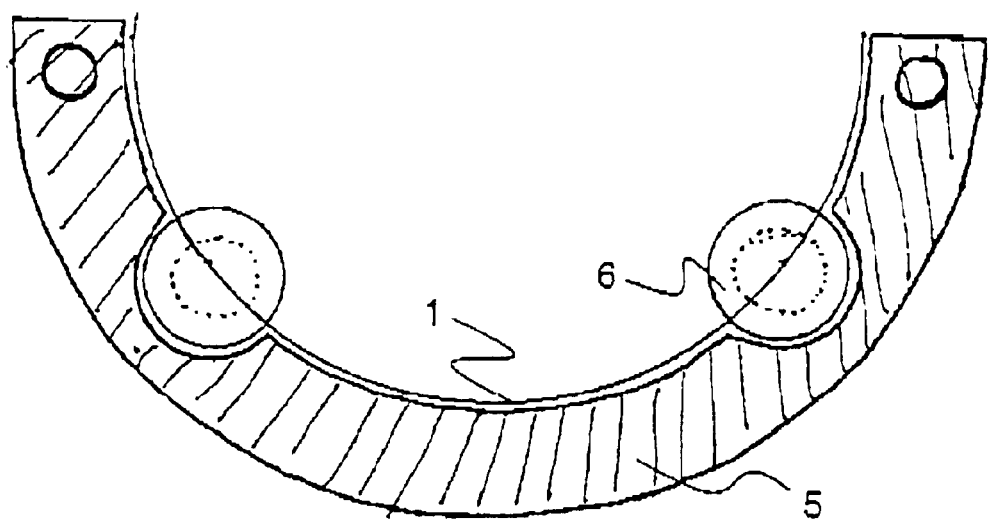
FIG. 2 shows a plan view of a semiconductor wafer and a protective shield adjacent to the edge of the wafer according to the first embodiment of the invention.

FIG. 2 illustrates how that edge 3 of the semiconductor wafer 1 onto which an etching medium flows in laminar form is shielded by a protective shield 5. In the embodiment shown, the protective shield 5 has pairs of guides 6, between which the semiconductor wafer 1 is held and, if appropriate, rotated. The action of the protective shield, the thickness of which preferably corresponds to the thickness of the semiconductor wafer, is clearly shown by FIG. 5. A laminar flow 2 of the etching medium comes into contact with the end side 7 of the protective shield 5. Immediately downstream of the end side, boundary layers with a turbulent flow 4 form on both sides of the protective shield 5. This occurs even if, as indicated in FIG. 5, the end 7 side is rounded. By the time the etching medium reaches the semiconductor wafer 1, the flow has changed from turbulent back to being purely a laminar flow, so that uniform etching abrasion is ensured. This is not the case if the protective shield is eliminated or dispensed with, and if the etching medium flows frontally onto the edge of the semiconductor wafer, as shown in FIG. 4.

Figure 3:
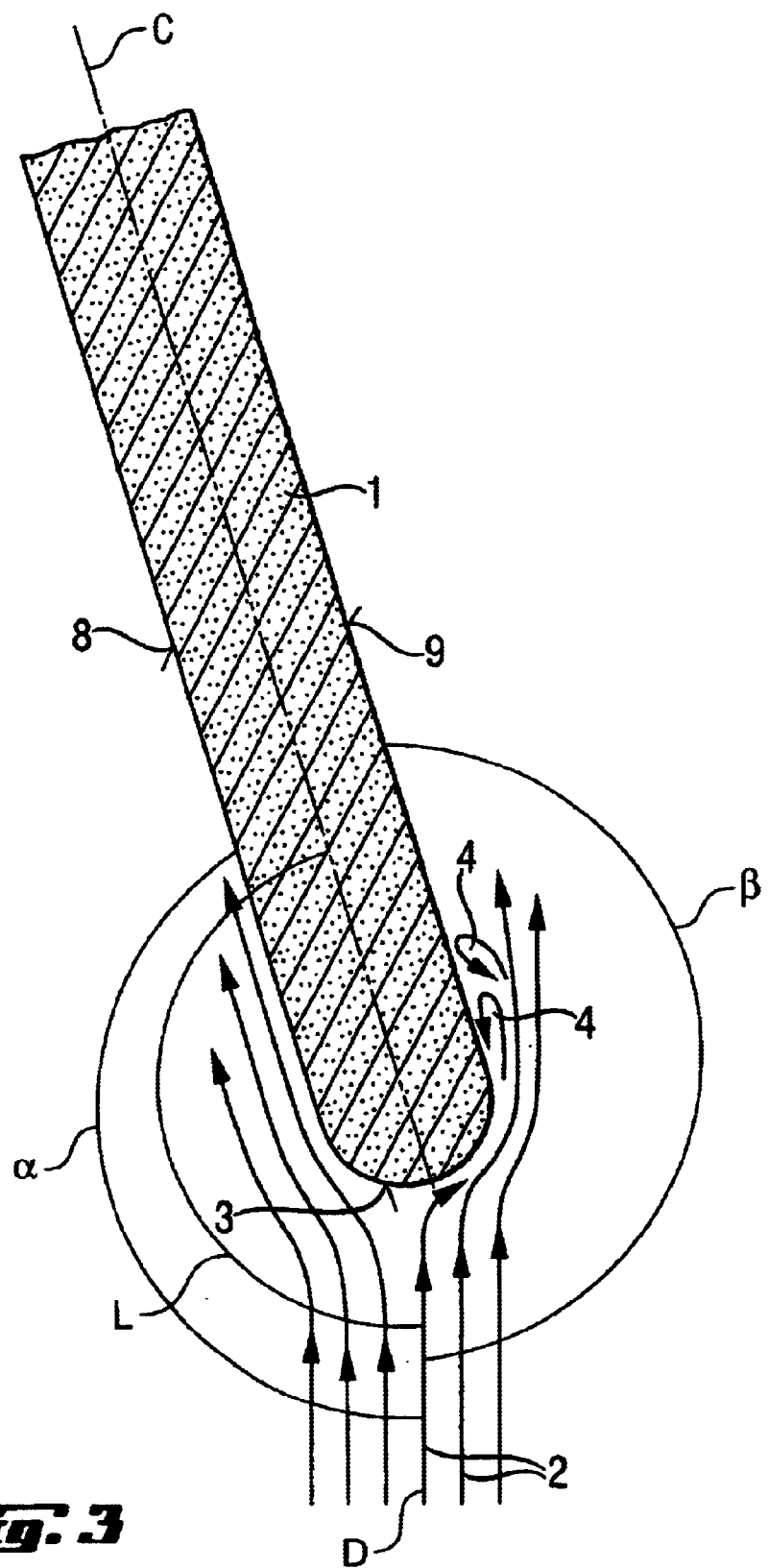
FIG. 3 shows the arrangement of a semiconductor wafer inclined relative to the direction of flow of the etching medium according to the second embodiment of the invention.

According to the second embodiment of FIG. 3 of the invention, the protective shield is dispensed with. The semiconductor wafer is inclined slightly with respect to the direction of flow D of the etching medium flowing toward the edge of the semiconductor wafer. Then the semiconductor wafer is subsequently polished. FIG. 3 shows this embodiment, wherein the semiconductor wafer is arranged, in accordance with the invention, and is inclined by an angle L of preferably to 1° to 10° out of the direction of flow D of the etching medium flowing toward the center line C of the semiconductor wafer. Thus, there is an angle α of less than 180° between the direction of flow D of the etching medium 2 flowing in a laminar flow toward the edge of the semiconductor wafer and a first side 8 of the semiconductor wafer 1. Then there is an angle β of greater than 180° between the direction of flow D of the etching medium 2 flowing in a laminar flow toward the semiconductor wafer and a second side 9 of the semiconductor wafer 1.

When the etching medium comes into contact with the edge 3 of the semiconductor wafer, the direction of the laminar flow changes in accordance with the inclination of the semiconductor wafer. Furthermore, a boundary layer with turbulent flow 4 forms only on the second side 9 of the semiconductor wafer 1 downstream of the edge, leading to increased etching abrasion in this region of the semiconductor wafer. The single-side unevenness which forms on the semiconductor wafer is subsequently eliminated by polishing the second side of the semiconductor wafer.

A further embodiment of the invention provides for the features of the first two embodiments to be combined. That is for a protective shield to be arranged in front of the edge of the semiconductor wafer; and for the semiconductor wafer to be inclined out of the direction of flow; and for the second side of the semiconductor wafer to be subsequently polished.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a semiconductor wafer having an edge, and a first side and a second side, by etching the semiconductor wafer comprising flowing an etching medium in a laminar flow along a direction of flow toward the edge of the semiconductor wafer;

placing a protective shield in front of the edge of the semiconductor wafer;

holding the semiconductor wafer with the protective shield; and causing the etching medium to flow firstly onto the protective shield and not onto the edge of the semiconductor wafer, and then causing the etching medium to have a laminar flow across the first side and the second side of the semiconductor wafer.

2. The process as claimed in claim 1, wherein the protective shield has a pair of guides between which the semiconductor wafer is held.

3. The process as claimed in claim 1, comprising rotating the semiconductor wafer during the etching.

4. The process as claimed in claim 3, comprising inclining the semiconductor wafer by 1° to 10° out of the direction of flow of the etching medium.

5. The process as claimed in claim 1, comprising inclining the semiconductor wafer with respect to the direction of flow of the etching medium, so that there is an angle of less than 180° between the direction of flow of the etching medium and the first side of the semiconductor wafer, and so that there is an angle of greater than 180° between the direction of flow of the etching medium and the second side of the semiconductor wafer; and subsequently polishing the second side of the semiconductor wafer.

6. The process as claimed in claim 5 comprising rotating the semiconductor wafer during the etching.

7. The process as claimed in claim 5, comprising inclining the semiconductor wafer by 1° to 10° out of the direction of flow of the etching medium.

* * * * *